(12) United States Patent
Kronholz et al.

(10) Patent No.: US 8,466,520 B2
(45) Date of Patent: Jun. 18, 2013

(54) TRANSISTOR WITH AN EMBEDDED STRAIN-INDUCING MATERIAL HAVING A GRADUALLY SHAPED CONFIGURATION

(75) Inventors: Stephan Kronholz, Dresden (DE); Vassilios Papageorgiou, Austin, TX (US); Gunda Beernink, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 13/470,441

(22) Filed: May 14, 2012

(65) Prior Publication Data

US 2012/0223363 A1    Sep. 6, 2012

Related U.S. Application Data

(62) Division of application No. 12/640,765, filed on Dec. 17, 2009, now Pat. No. 8,202,777.

(30) Foreign Application Priority Data

Dec. 31, 2008    (DE) .......................... 10 2008 063 427

(51) Int. Cl.
*H01L 21/02*    (2006.01)
(52) U.S. Cl.
USPC ............. 257/408; 257/190; 257/194; 257/18; 257/255; 257/369; 257/E29.246; 257/E21.403; 438/230; 438/231; 438/285; 438/938
(58) Field of Classification Search
USPC ................. 257/408, 190, 194, 18, 255, 369, 257/E29.246, E21.403; 438/230, 231, 285, 438/938
See application file for complete search history.

(56) References Cited

U.S. PATENT DOCUMENTS

| | | | |
|---|---|---|---|
| 6,239,467 B1 | 5/2001 | Gardner et al. ............... | 257/344 |
| 7,429,775 B1 | 9/2008 | Nayak et al. .................. | 257/369 |
| 2005/0218427 A1* | 10/2005 | Joshi et al. .................... | 257/192 |
| 2007/0020861 A1* | 1/2007 | Chong et al. .................. | 438/296 |
| 2007/0096194 A1 | 5/2007 | Streck et al. .................. | 257/315 |
| 2007/0210301 A1* | 9/2007 | Han ................................ | 257/18 |
| 2008/0067557 A1* | 3/2008 | Yu et al. ........................ | 257/255 |
| 2008/0079033 A1 | 4/2008 | Waite et al. ................... | 257/255 |
| 2008/0128746 A1 | 6/2008 | Wang ............................ | 257/190 |

OTHER PUBLICATIONS

Translation of Official Communication from German Patent Office for German Patent Application No. 10 2008 063 427.1 dated Oct. 27, 2009.

* cited by examiner

*Primary Examiner* — Tu-Tu Ho
(74) *Attorney, Agent, or Firm* — Williams, Morgan & Amerson, P.C.

(57) ABSTRACT

In a transistor, a strain-inducing semiconductor alloy, such as silicon/germanium, silicon/carbon and the like, may be positioned very close to the channel region by providing gradually shaped cavities which may then be filled with the strain-inducing semiconductor alloy. For this purpose, two or more "disposable" spacer elements of different etch behavior may be used in order to define different lateral offsets at different depths of the corresponding cavities. Consequently, enhanced uniformity and, thus, reduced transistor variability may be accomplished, even for sophisticated semiconductor devices.

7 Claims, 10 Drawing Sheets

TRANSISTOR WITH AN EMBEDDED STRAIN-INDUCING MATERIAL HAVING A GRADUALLY SHAPED CONFIGURATION

BACKGROUND OF THE INVENTION

1. Field of the Invention

Generally, the present disclosure relates to the fabrication of integrated circuits, and, more particularly, to transistors having strained channel regions by using embedded semiconductor materials to enhance charge carrier mobility in the channel regions of the transistors.

2. Description of the Related Art

The fabrication of complex integrated circuits requires the provision of a large number of transistor elements, which represent the dominant circuit element for complex circuits. For example, several hundred millions of transistors may be provided in presently available complex integrated circuits. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. During the fabrication of complex integrated circuits using CMOS technology, transistors, i.e., N-channel transistors and P-channel transistors, are formed on a substrate including a crystalline semiconductor layer. A MOS transistor, or generally a field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions to provide low sheet and contact resistivity in combination with a desired channel controllability. Moreover, the gate dielectric material may also be adapted to the reduced channel length in order to maintain the required channel controllability. However, some mechanisms for maintaining a high channel controllability may also have a negative influence on the charge carrier mobility in the channel region of the transistor, thereby partially offsetting the advantages gained by the reduction of the channel length.

Since the continuous size reduction of the critical dimensions, i.e., the gate length of the transistors, necessitates the adaptation and possibly the new development of highly complex process techniques and may also contribute to less pronounced performance gain due to mobility degradation, it has been proposed to enhance the channel conductivity of the transistor elements by increasing the charge carrier mobility in the channel region for a given channel length, thereby enabling a performance improvement that is comparable with the advance to a technology standard requiring extremely scaled critical dimensions, while avoiding or at least postponing many of the process adaptations associated with device scaling.

One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region for a standard crystallographic configuration of the active silicon material, i.e., a (100) surface orientation with the channel length aligned to the <110> direction, increases the mobility of electrons, which in turn may directly translate into a corresponding increase in conductivity. On the other hand, compressive strain in the channel region may increase the mobility of holes, thereby providing the potential for enhancing the performance of P-type transistors. The introduction of stress or strain engineering into integrated circuit fabrication is an extremely promising approach, since strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium (Si/Ge) material next to the channel region to induce a compressive stress that may result in a corresponding strain. When forming the Si/Ge material, the drain and source regions of the PMOS transistors are selectively recessed to form cavities, while the NMOS transistors are masked, and subsequently the silicon/germanium material is selectively formed in the cavities of the PMOS transistor by epitaxial growth.

Although the technique has significant advantages in view of performance gain of P-channel transistors and thus of the entire CMOS device, it turns out, however, that, in advanced semiconductor devices including a large number of transistor elements, an increased variability of device performance may be observed, which may be associated with the above-described technique for incorporating a strained silicon/germanium alloy in the drain and source regions of P-channel transistors, in particular when the offset of the silicon/germanium material from the channel region is to be reduced in view of increasing the finally achieved strain, as will be described in more detail with reference to FIGS. 1a-1e.

FIG. 1a schematically illustrates a cross-sectional view of a conventional semiconductor device 100 comprising a P-channel transistor 150A and an N-channel transistor 150B, wherein the performance of the transistor 150A is to be enhanced on the basis of a strained silicon/germanium alloy, as explained above. The semiconductor device 100 comprises a substrate 101, such as a silicon substrate, which may have formed thereon a buried insulating layer 102. Furthermore, a crystalline silicon layer 103 is formed on the buried insulating layer 102, thereby forming a silicon-on-insulator (SOI) configuration. An SOI configuration may be advantageous in view of overall transistor performance since, for instance, the parasitic junction capacitance of the transistors 150A, 150B may be reduced compared to a bulk configuration, i.e., a configuration in which a thickness of the silicon layer 103 may be significantly greater than a vertical extension of the transistors 150A, 150B into the layer 103. The transistors 150A, 150B may be formed in and above respective "active" regions generally indicated as 103A, 103B, respectively, wherein the active regions may be separated by an isolation structure 104, such as a shallow trench isolation. In the manufacturing stage shown, the transistors 150A, 150B comprise a gate electrode structure 151, which may be understood as a structure including a conductive electrode material 151A, representing the actual gate electrode, which may be formed on a gate insulation layer 151B, thereby electrically insulating the gate electrode material 151A from a channel region 152 located within the corresponding active regions 103A, 103B, respectively. Furthermore, the gate electrode structures 151 may comprise a cap layer 151C, for instance comprised of silicon nitride. Furthermore, a spacer structure 105 may be formed on sidewalls of the gate electrode structure 151 in the transistor 150A, thereby encapsulating, in combination with the cap layer 151C, the gate electrode material 151A. On the other hand, a mask layer 105A may be formed above the transistor 150B, thereby encapsulating the corresponding gate electrode material 151A and also covering the active region 103B. Moreover, a mask 106, such as a resist mask and the like, may be formed so as to cover the mask layer 105A while exposing the transistor 150A.

The conventional semiconductor device 100 as shown in FIG. 1a may be formed on the basis of the following process strategy. The active regions 103A, 103B may be defined on the basis of the isolation structure 104, which may be formed by using well-established photolithography, etch, deposition and planarization techniques. Thereafter, the basic doping level in the corresponding active regions 103A, 103B may be established, for instance by implantation processes performed on the basis of an appropriate masking regime. Next, the gate electrode structures 151 are formed by using complex lithography and patterning regimes to obtain the gate electrode material 151A and the gate insulation layer 151B, wherein the cap layer 151C may also be patterned. Next, the mask layer 105A may be deposited, for instance by well-established low pressure chemical vapor deposition (CVD) techniques, thereby forming silicon nitride, possibly in combination with a silicon dioxide material, as an etch stop liner. The low pressure CVD techniques may, although providing a high degree of controllability, nevertheless exhibit a certain non-uniformity across the substrate 101, which may result in an increased thickness at the substrate edge compared to the center of the substrate. Consequently, upon forming the mask 106 and exposing the device 100 to an anisotropic etch ambient for forming the spacer structure 105 from the previously deposited mask layer 105A, a certain degree of non-uniformity of the resulting width 105W may be created, which may, for instance, result in slightly increased width at the periphery of the substrate 101 compared to central areas of the substrate 101. Since the spacer structure 105 may substantially define a lateral offset of a cavity to be formed in the active region 103A by anisotropic etch techniques, also the corresponding lateral offset may slightly vary according to the non-uniformities introduced during the deposition of the mask layer 105A and performing the subsequent anisotropic etch process. On the other hand, in sophisticated applications, a lateral offset of a corresponding strained silicon/germanium alloy may be reduced in view of enhancing the overall strain in the adjacent channel region 152, thereby requiring the width 105W to be reduced so as to position the strained silicon/germanium alloy closer to the channel region 152. Typically, the strain in the channel region 152 may increase over-proportionally for a reduced width 105W so that, in sophisticated process strategies wanting to provide a moderately small width 105W, the variability caused by the deposition of the layer 105A and the subsequent etch process may be increased over-proportionally, thereby contributing to a high degree of variability of the resulting performance of the transistors 150A for extremely scaled semiconductor devices.

FIG. 1b schematically illustrates the semiconductor device 100 during an anisotropic plasma assisted etch process 107, in which appropriate etch chemistries, for instance on the basis of hydrogen bromide and the like, may be used in combination with appropriate organic additives so that the corresponding anisotropic etch behavior may be obtained in combination with appropriately selected plasma conditions. However, as explained above, a certain degree of variability may also be induced during the plasma assisted etch process 107, thereby also contributing to the overall variability, in particular if highly sophisticated transistors are considered in which even a minute difference in the lateral offset may thus result in a significant change of transistor performance. Consequently, due to the varying width 105W caused by the preceding deposition of the layer 105A and the corresponding anisotropic etch process for forming the spacer structure 105, possibly in combination with the anisotropic etch process 107 used for forming respective cavities 107A, the position and size thereof may also exhibit a corresponding degree of variability.

FIG. 1c schematically illustrates the semiconductor device 100 in a further advanced manufacturing stage. That is, after forming the cavities 107A, the mask 106 (FIG. 1b) is removed and a selective epitaxial growth process is performed to deposit a silicon/germanium alloy 109 in the transistor 150A, while the transistor 150B is covered by the mask layer 105A. Corresponding selective epitaxial growth recipes are well established, in which the corresponding process parameters, such as pressure, temperature, precursor flow rates and the like, are appropriately selected so as to obtain a significant deposition of the silicon/germanium material on exposed crystalline silicon surfaces, while a corresponding material deposition on dielectric surface areas is significantly reduced or even negligible. Thus, the silicon/germanium material 109 may be grown in a strained state, since the natural lattice constant of silicon/germanium is greater than the lattice constant of silicon, thereby obtaining a compressively strained material which may also result in a corresponding compressive strain in the adjacent channel region 152. The magnitude of the compressive strain may depend on the position and the size of the previously formed cavities and on the germanium concentration within the material 109. Thus, for given process parameters during the selective epitaxial growth process for forming the material 109, the variability of the preceding manufacturing processes for forming the mask layer 105A, patterning the spacer structure 105 and forming the cavities 107A may result in a certain non-uniformity of transistor performance across the substrate 101.

FIG. 1d schematically illustrates the semiconductor device 100 in a further advanced manufacturing stage in which the mask layer 105A, the spacer structure 105 and the cap layers 151C (FIG. 1c) are removed, which may be accomplished by well-established selective etch techniques. Thereafter, the further processing may be continued by forming drain and source regions according to the device requirements.

FIG. 1e schematically illustrates the semiconductor device 100 in a manufacturing stage in which the basic transistor configuration is substantially completed. As illustrated, the transistors 150A, 150B may comprise a sidewall spacer structure 153, which may include one or more spacer elements 153A, possibly in combination with corresponding etch stop liners 153B, depending on the required complexity of the dopant profile of drain and source regions 154. The spacer structure 153 may be formed in accordance with well-established techniques, i.e., by depositing the etch stop liner 153B and a corresponding mask layer which may then be patterned by anisotropic etch processes so as to form the spacer element 153A. Prior to forming the spacer structure 153, appropriate implantation processes may be performed to define extension regions 154E, which in combination with deep drain and source areas 154D, which may be formed on the basis of the spacer structure 153, represent the drain and source regions 154. Thereafter, the dopants may be activated by annealing the device 100, thereby also re-crystallizing, at least to a certain degree, implantation-induced damage. Thereafter, further processing may be continued by forming metal silicide regions and forming a corresponding contact structure, possibly on the basis of stressed dielectric materials, in accordance with well-established process strategies. As explained above, for sophisticated applications, performance of the transistor 150A may be substantially determined by the strain-inducing mechanism provided by the silicon/germanium alloy 109, wherein the moderately high degree of variability, in particular for a desired reduced lateral offset of the silicon/germanium material 109 from the channel region 152, may cause reduced production yield, while, in other cases, the potential of the strain-inducing mechanism provided by the material 109 may not be fully exploited since a corresponding offset from the channel region 152 has to be maintained greater than desirable.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and techniques in which cavities may be formed in active regions of transistor devices with enhanced controllability with respect to the lateral offset to the channel region on the basis of two or more dedicated spacer elements, thereby enabling a gradually shaped configuration of the cavities and thus of the strain-inducing semiconductor alloy to be formed therein. Due to the manufacturing sequence based on the fabrication of two or more spacer elements, an enhanced degree of flexibility in defining the configuration of the strain-inducing semiconductor alloy may be accomplished, since, for instance, a first portion of the cavities may be provided with a reduced depth and a desired small offset from the channel region, which may thus be accomplished on the basis of a well-controllable etch process, thereby reducing process non-uniformities, which may conventionally result in a significant transistor variability, as previously explained. Thereafter, in one or more additional etch processes, the depth and lateral extension of the cavities may be appropriately adapted so as to obtain a high overall strain-inducing effect, while nevertheless reducing overall process non-uniformities. Additionally, in some illustrative aspects disclosed herein, the manufacturing sequence for forming the strain-inducing semiconductor alloy on the basis of two or more spacer elements may also provide increased flexibility in providing the semiconductor alloy with different characteristics, for instance in view of in situ doping, material composition and the like. Consequently, the scalability of the strain-inducing mechanism obtained on the basis of an embedded semiconductor alloy may be extended by not unduly compromising uniformity of transistor characteristics and not unduly contributing to overall process complexity.

One illustrative method disclosed herein comprises forming first recesses in a crystalline semiconductor region with an offset from a gate electrode structure defined by a first sidewall spacer formed on the sidewalls of the gate electrode structure, wherein the first recesses extend to a first depth. The method further comprises forming second recesses in the crystalline semiconductor region with an offset from the gate electrode structure that is defined by a second sidewall spacer formed on the first sidewall spacer, wherein the second recesses extend to a second depth that is greater than the first depth. Additionally, the method comprises forming a strain-inducing semiconductor alloy in the first and second recesses by performing a selective epitaxial growth process.

A further illustrative method disclosed herein comprises forming a first spacer layer above a first semiconductor region having formed thereon a first gate electrode structure and above a second semiconductor region having formed thereon a second gate electrode structure. The method further comprises selectively forming a first sidewall spacer from the first spacer layer on sidewalls of the first gate electrode structure. Furthermore, a first etch process is performed so as to form cavities in the first semiconductor region on the basis of the first sidewall spacer. Additionally, a second sidewall spacer is formed on the first sidewall spacer and a second etch process is performed to increase a depth of the cavities on the basis of the second sidewall spacer. Finally, a strain-inducing semiconductor alloy is formed in the cavities.

One illustrative semiconductor device disclosed herein comprises a transistor formed above a substrate, wherein the transistor comprises a gate electrode structure formed above a crystalline semiconductor region and comprising a gate electrode material. The transistor further comprises a first strain-inducing semiconductor alloy formed in the crystalline semiconductor region and having a first depth and a first lateral offset from the gate electrode material. Additionally, a second strain-inducing semiconductor alloy is formed in the crystalline semiconductor region and has a second depth and a second lateral offset from the gate electrode material, wherein the first and second depth are different and wherein the first and second lateral offsets are different.

BRIEF DESCRIPTION OF THE DRAWINGS

The disclosure may be understood by reference to the following description taken in conjunction with the accompanying drawings, in which like reference numerals identify like elements, and in which.

Figure 1A:
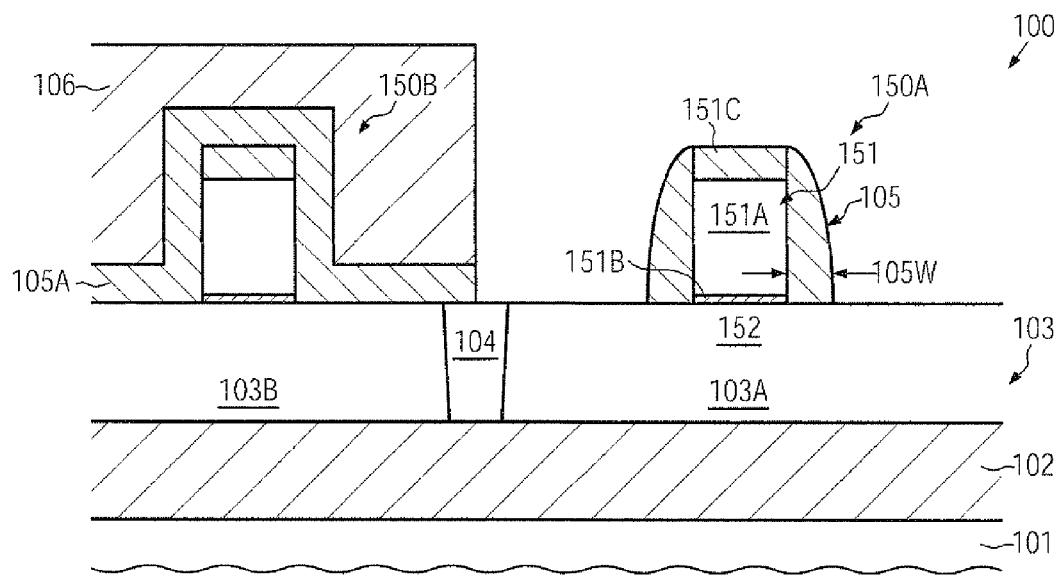
FIGS. 1a-1e schematically illustrate cross-sectional views of a conventional semiconductor device comprising a P-channel transistor during various manufacturing stages in forming a silicon/germanium alloy on the basis of a complex conventional manufacturing sequence.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure describes techniques and semiconductor devices in which sophisticated lateral and vertical configurations of a strain-inducing semiconductor alloy may be accomplished on the basis of an appropriate sequence for forming corresponding cavities adjacent to and offset from a gate electrode structure. The gradually shaped configuration of the cavities thus enable a reduced lateral offset from the channel region while nevertheless enabling a high degree of controllability of the corresponding etch process, since undue exposure to the etch ambient may be avoided by restricting the depth of the corresponding etch process. Thereafter, one or more further etch processes may be performed on the basis of appropriately configured spacer elements, in which the depth of the cavities may be increased, while, however, the one or more additional spacer elements may provide an increased offset, thereby also reducing an influence of etch related non-uniformities on the finally obtained transistor characteristics. Consequently, a moderately high amount of strain-inducing semiconductor alloy may be formed in the cavities, wherein a reduced lateral offset from the channel region may be accomplished at a height level that is in close proximity to the height level of the gate insulation layer, wherein, however, a high degree of controllability of the corresponding cavity and the subsequent deposition process may be accomplished, thereby not unduly contributing to device variability. In some illustrative embodiments disclosed herein, an enhanced flexibility in designing the overall characteristics of the strain-inducing semiconductor alloy may be obtained, for instance, by providing the semiconductor alloy with different degrees of in situ doping, thereby providing the possibility of adjusting a desired dopant profile with enhanced flexibility. Moreover, in some illustrative aspects disclosed herein, the gradually shaped configuration of the cavities may be accomplished on the basis of two or more spacer elements, which may be formed without requiring additional lithography steps, thereby contributing to a highly efficient overall manufacturing process flow. In other illustrative embodiments, the gradually shaped configuration of the cavities may be accomplished by providing a spacer structure whose width may be sequentially reduced, followed by a corresponding etch process, thereby continuously increasing the depth of exposed portion of the cavities, while continuously reducing the lateral offset from the channel region, wherein a final etch step may be performed with a high degree of controllability on the basis of a dedicated spacer element. In this final etch process, the required etch depth may also be reduced so that, in this case, enhanced process uniformity may be achieved. Consequently, the present disclosure provides manufacturing techniques and semiconductor devices in which the effect of added strain-inducing semiconductor alloys, such as a silicon/germanium alloy, a silicon/germanium/tin alloy, a silicon/tin alloy, a silicon/carbon alloy and the like, may be enhanced, even for transistor elements having critical dimensions of 50 nm and significantly less, since the gradually shaped configuration of these materials and the manufacturing sequences involved may provide enhanced process uniformity and thus reduced variability of transistor characteristics, thereby providing a certain degree of scalability of these performance increasing mechanisms.

With reference to FIGS. 2a-2l, further illustrative embodiments will now be described in more detail, wherein reference may also be made to FIGS. 1a-1e, if required.

Figure 1B:
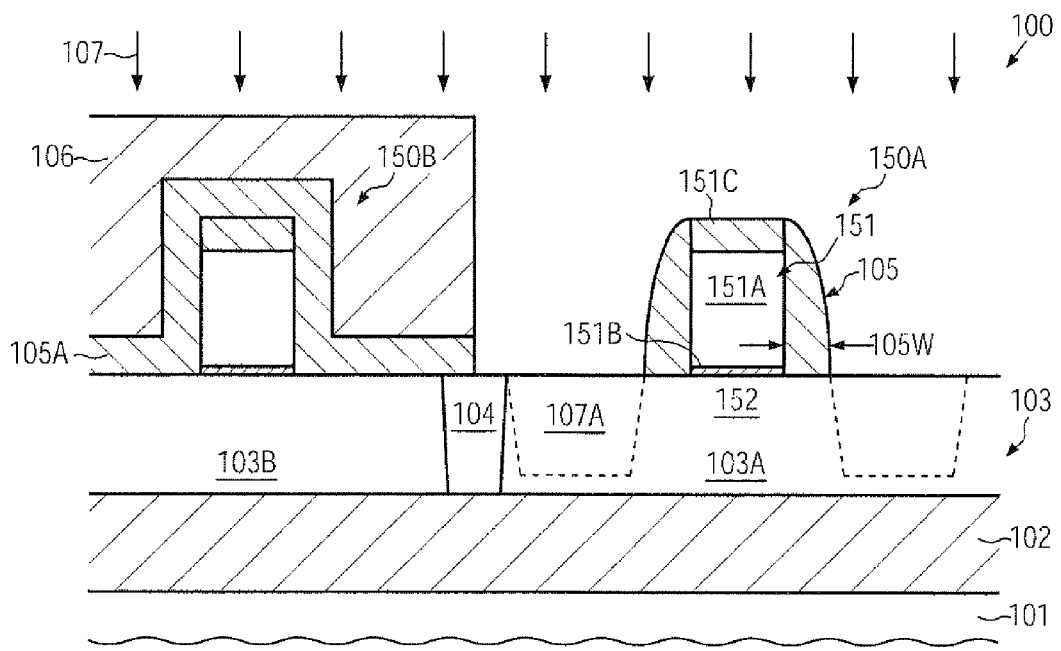
Figure 1C:
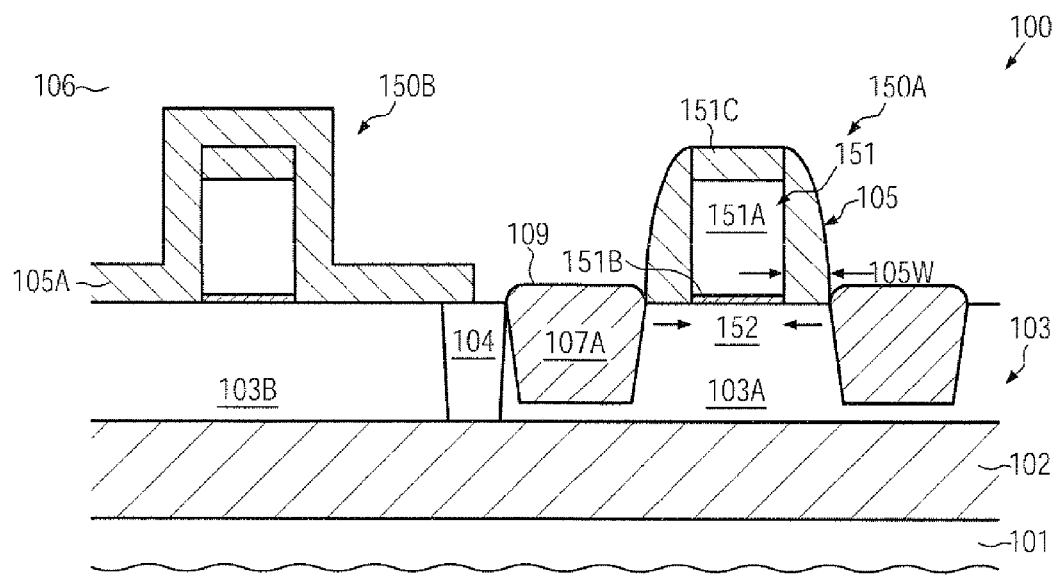
Figure 1D:
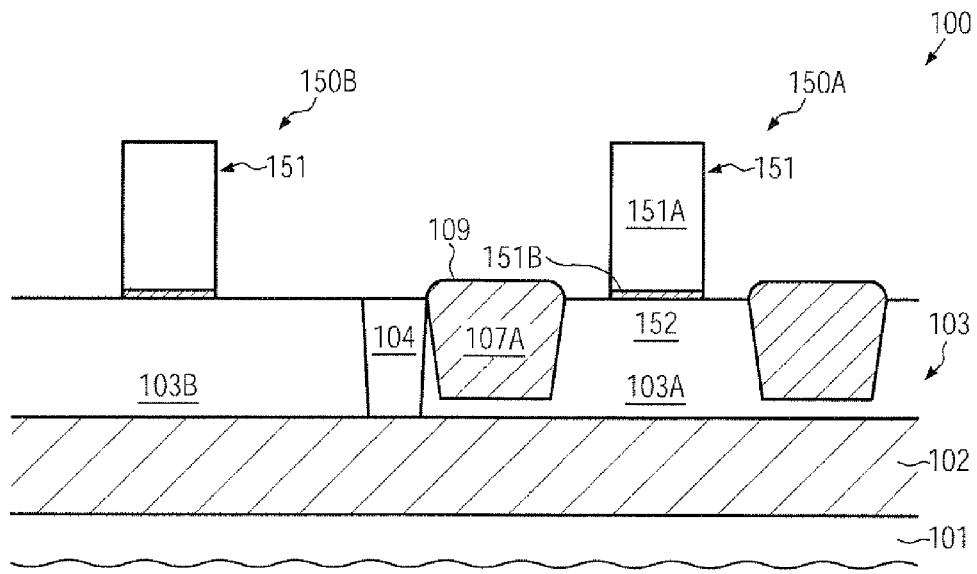
Figure 1E:
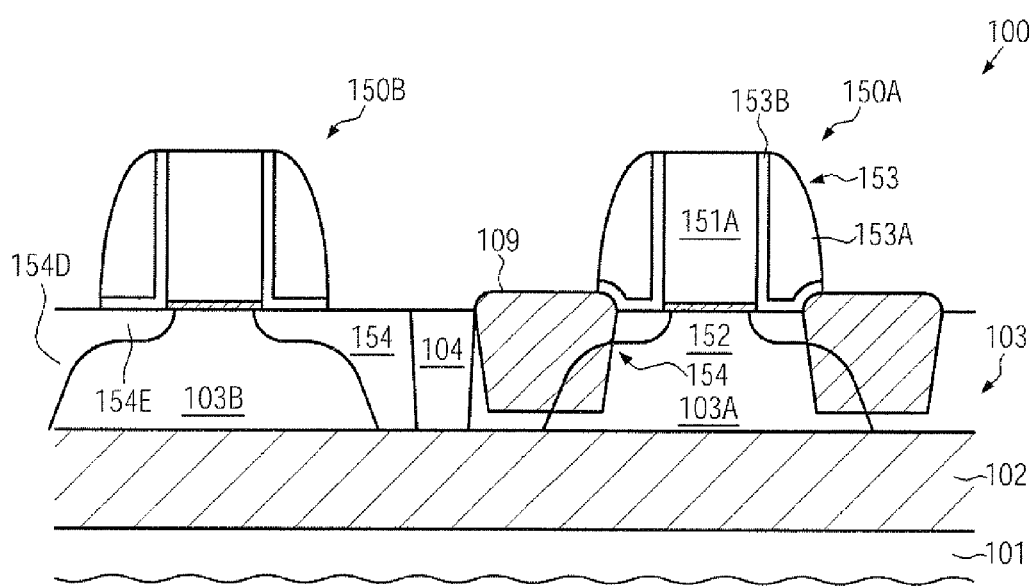
Figure 2A:
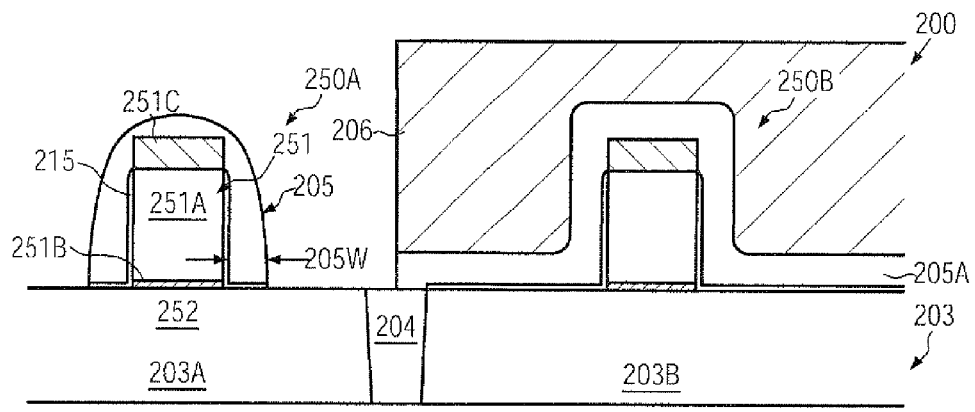
FIGS. 2a-2g schematically illustrate cross-sectional views of a semiconductor device during various manufacturing stages in forming a strain-inducing semiconductor alloy on the basis of a graded cavity, according to illustrative embodiments.

FIG. 2a schematically illustrates a cross-sectional view of a semiconductor device 200, which may comprise a substrate 201 and a semiconductor layer 203 formed above the substrate 201. The substrate 201, in combination with the semiconductor layer 203, may represent any appropriate device architecture, such as a bulk configuration, an SOI configuration and the like, as is also described with reference to the semiconductor device 100 as illustrated in FIGS. 1a-1e. For instance, in the case of an SOI configuration, a buried insulating layer (not shown) may be position between the substrate 201 and the semiconductor layer 203, as is also previously explained. Furthermore, the semiconductor device 200 may comprise an isolation structure 204, which may separate a first active region or semiconductor region 203A from a second active semiconductor region 203B, which represent respective portions of the semiconductor layer 203, in and above which corresponding transistors 250A, 250B are formed. In the manufacturing stage shown, the transistors 250A, 250B may comprise a gate electrode structure 251, which may include a gate electrode material 251A and a gate insulation layer 251B, which may separate the gate electrode material 251A from a channel region 252 of the active regions 203A, 203B, respectively. Moreover, the gate electrode structures 251 may comprise a cap layer 251C, as is also previously explained with reference to the semiconductor device 100. Moreover, an etch stop liner 215, for instance an oxide material and the like, may be formed on sidewalls of the gate electrode material 251A and may also be formed on the material of the active regions 203A, 203B. For example, in some illustrative embodiments, the active regions 203A, 203B may be substantially comprised of silicon material and hence the layer 215 may represent a silicon dioxide material. It should be appreciated, however, that, in other cases, a liner material may be deposited, for instance in the form of silicon dioxide, silicon nitride and the like. In this case, the etch stop liner 215 may also be formed on exposed surface areas of the cap layer 251C. Moreover, a spacer layer 205A, which, in one illustrative embodiment, is comprised of silicon dioxide, may be formed above the semiconductor region 203B and the gate electrode structure 251 of the transistor 250B. On the other hand, a spacer element 205 may be formed on the sidewalls of the gate electrode structure 251, i.e., on the etch stop liner 215, if provided. The spacer element 205 may have a well-defined width 205W, which may substantially determine a lateral offset of a strain-inducing semiconductor alloy to be formed in a later manufacturing stage. The width 205W may, in some illustrative embodiments, be selected to several nanometers and less, such as approximately 2 nm and less, since undue transistor variability of the transistor 250A may be reduced by selecting an appropriate etch depth in combination with the lateral width 205W, thereby enhancing overall process uniformity, as will be described later on in more detail.

The semiconductor device 200 as illustrated in FIG. 2A may be formed on the basis of the following processes. The isolation structure 204 and the gate electrode structure 251 may be formed by using process techniques, as are also previously discussed with reference to the device 100. Thereafter, the etch stop liner 215, if required, may be formed, for instance, by oxidation, deposition and the like, followed by the deposition of the spacer layer 205A, which may be accomplished by well-established CVD techniques. As previously explained, the thickness of the spacer layer 205A may be selected so as to obtain a desired reduced width 205W of the spacer elements 205, since a corresponding further process sequence may provide enhanced uniformity in forming a gradually shaped cavity, which may thus reduce any process related transistor variabilities. In some illustrative embodiments, the spacer layer 205A may be formed on the basis of a silicon dioxide material using well-established deposition recipes. In other illustrative embodiments, the spacer layer 205A may be provided in the form of a different material, such as silicon nitride and the like, and other appropriate materials may be used in a later manufacturing stage for providing an additional sidewall spacer element, as will be explained later on. Next, an etch mask 206, such as a resist mask, may be formed by lithography so as to expose the spacer layer 205A above the transistor 250A and covering the spacer layer 205A above the transistor 250B. Thereafter, an appropriate anisotropic etch process may be performed to remove material of the spacer layer 205A selectively to the etch stop liner 215, if provided, or at least selectively to the material of the semiconductor region 203A, thereby providing the spacer element 205 having the width 205W.

Figure 2B:
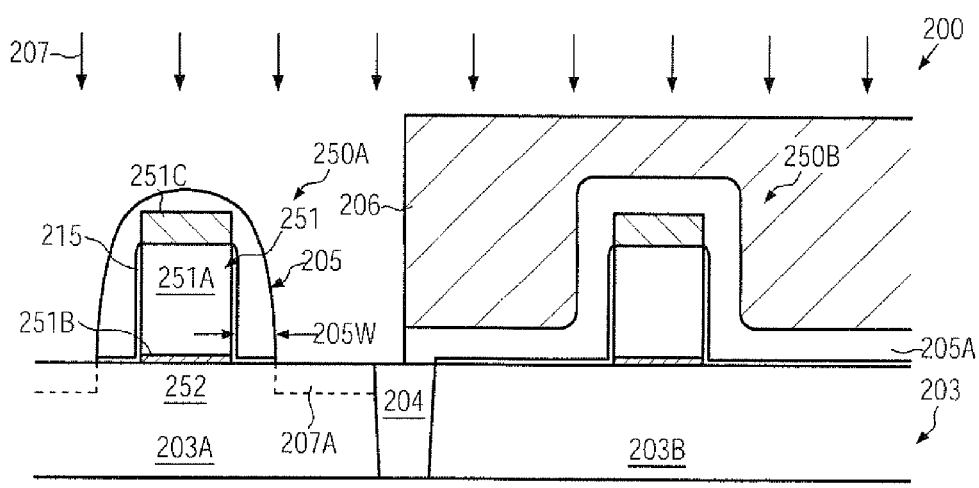

FIG. 2b schematically illustrates the semiconductor device 200 when exposed to an etch ambient 207, which may represent an anisotropic plasma-assisted etch process for removing material of the semiconductor region 203A selectively with respect to spacer element 205 in order to form a first recess or a portion of a cavity 207A. In the embodiment illustrated in FIG. 2b, the etch process 207 may be performed on the basis of the etch mask 206, while, in other illustrative embodiments, the mask 206 may be removed prior to performing the etch process 207, thereby using the spacer layer 205A as an etch mask for protecting the semiconductor region 203B and the gate electrode structure 251 of the transistor 250B. It should be appreciated that, contrary to conventional strategies, the etch process 207 may be performed so as to obtain a reduced depth of the recess 207A by selecting a corresponding reduced etch time for a given chemistry so that a high degree of controllability and thus uniformity of a lateral offset of the recess 207A from the channel region 252 may be achieved. Consequently, even for an overall reduced lateral offset as defined by the width 205W, enhanced across-substrate uniformity of the resulting transistor characteristics may be accomplished, since a corresponding variability of the lateral etch rate during the process 207 may be reduced compared to process strategies in which a significantly larger depth of the corresponding cavities, such as the cavities 107A in FIG. 1B, is required. Consequently, based on well-established selective anisotropic etch recipes, superior control of the lateral position of a strain-inducing material may be accomplished by forming the recesses 207A with a reduced depth.

In still other illustrative embodiments, the etch process 207 may be performed on the basis of a wet chemical etch recipe, wherein the reduced depth of the recess 207A may also provide highly controllable lateral etch rates, so that, based on the initial spacer width 205W, a corresponding well-defined lateral offset may be obtained. For example, due to the reduced depth of the recess 207A, an isotropic wet chemical etch ambient may be established, in which the corresponding lateral etch rate may thus also be well controllable, thereby providing superior integrity of, for instance, the gate insulation layer 251B at the edge of the gate electrode structure 251, while nevertheless the lateral offset of the recess 207A from the channel region 252 may be adjusted on the basis of low values without compromising uniformity of transistor characteristics.

Figure 2C:
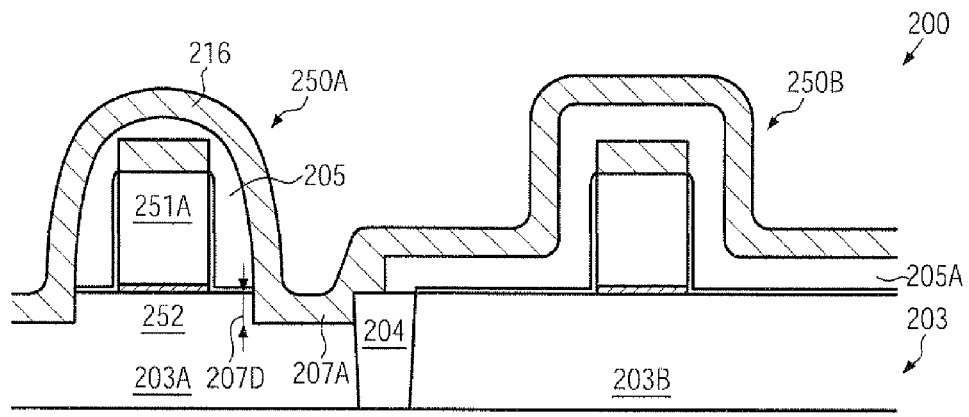

FIG. 2c schematically illustrates the semiconductor device 200 in a further advanced manufacturing stage. As illustrated, the recess 207A may be formed in the semiconductor region 203A down to a depth 207D, which may provide enhanced overall process control, as previously explained. Moreover, a further spacer layer 216 is formed above the first and second transistors 250A, 250B, wherein the spacer layer 216 may be comprised of a material that differs from the material of the spacer layer 205A. For example, in one illustrative embodiment, the spacer layer 216 may be comprised of silicon nitride, while the spacer layer 205A may be formed on the basis of silicon dioxide. It should be appreciated that, in other illustrative embodiments, as discussed above, the spacer layer 216 may be comprised of different materials, such as silicon dioxide, as long as the spacer layer 205A and thus the spacer element 205 may be formed on the basis of a material having different etch characteristics. The spacer layer 216 may be provided with an appropriate thickness so as to obtain, in combination with corresponding etch process parameters, an appropriate thickness for spacer elements to be formed on the basis of the spacer layer 216. For this purpose, any well-established deposition techniques may be used.

Figure 2D:
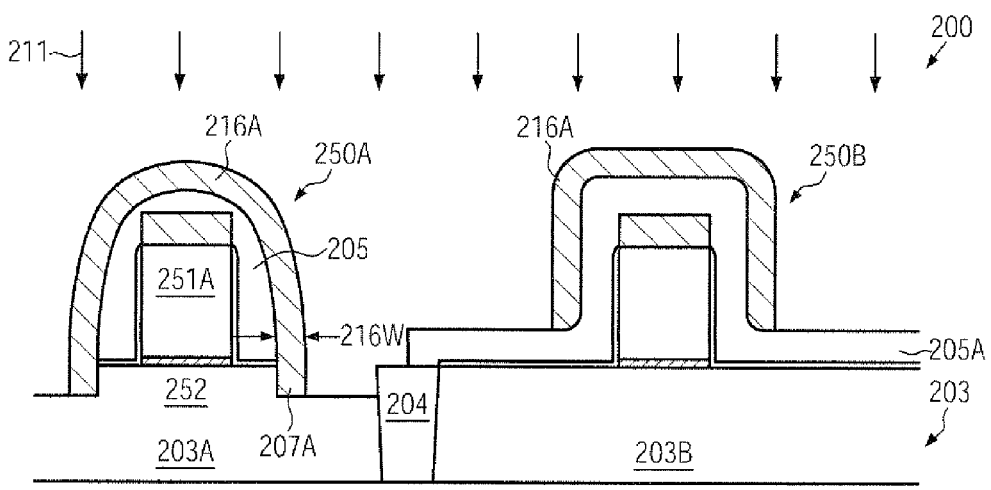

FIG. 2d schematically illustrates the semiconductor device 200 during a further anisotropic etch process 211 in order to form a spacer element 216A at least on the spacer element 205 in the transistor 250A. For this purpose, well-established selective anisotropic etch recipes are available in which, for instance, silicon nitride material may be selectively removed with respect to silicon dioxide material and silicon material. Furthermore, in the embodiment shown in FIG. 2d, the anisotropic etch process 211 may be performed as a non-mask process, thereby also forming a corresponding spacer element 216A on the spacer layer 205A in the transistor 250B. Consequently, the spacer element 216A of the transistor 250A may be provided without an additional lithography step, thereby contributing to a very efficient overall manufacturing flow. In other illustrative embodiments, when a material removal of the spacer layer 205A during the etch process 211 is considered inappropriate, for instance, due to a less pronounced etch selectivity of the process 211 and/or due to a reduced thickness of the spacer layer 205A, a further etch mask, such as the etch mask 206 (FIG. 2b), may be formed to cover the transistor 250B, prior to performing the etch process 211. Consequently, during the etch process 211, the recesses 207A formed in the semiconductor region 203A may be exposed while at the same time providing the spacer element 216A with a desired width 216W. For example, the width 216W may be selected so as to obtain a desired gradual shape of a semiconductor material still to be formed in the region 203A, while at the same time a high degree of controllability of the lateral shape of the resulting cavity may be accomplished. Moreover, the vertical extension of the resulting cavity may be controlled with enhanced efficiency, since the required degree of material removal may be significantly less pronounced compared to conventional strategies, in which corresponding cavities may have to be formed in a single etch step.

Figure 2E:
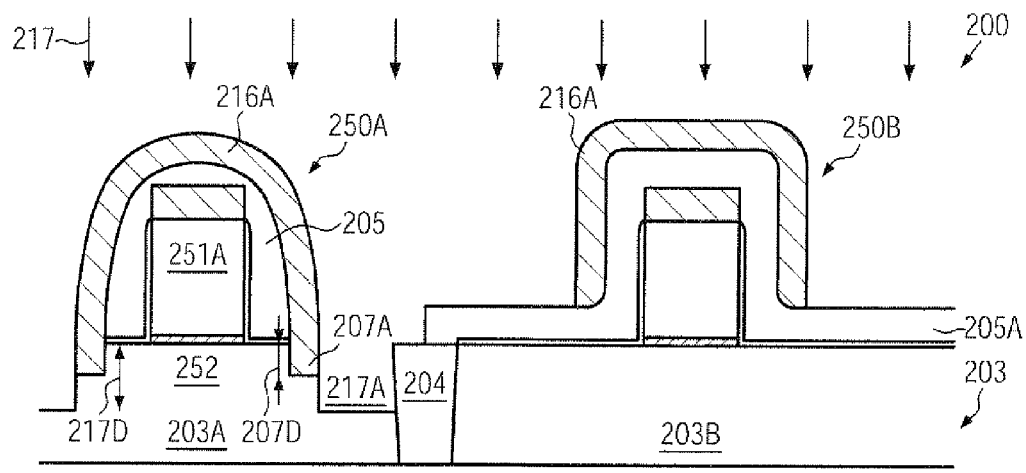

FIG. 2e schematically illustrates the semiconductor device 200 when exposed to a further etch process 217, in which a further recess 217A may be formed in the exposed portion of the previously-formed recess 207A. Hence, based on the process parameters of the etch ambient 217 and the width 216W (FIG. 2d) of the spacer element 216A, the lateral offset of the further recess 217A may be defined, while a depth thereof may be adjusted on the basis of the process time for a given removal rate during the process 217. In some illustrative embodiments, the recess 217A may be formed so as to extend to a depth 217D, which may correspond to a finally desired depth of a cavity represented by the recesses 207A and 217A, for example 50-90 percent of the thickness of the base layer 203. In this case, the depth 217D is to be considered as a combination of the depth of the recess 207A and a depth obtained during the further etch process 217. It should be appreciated that even if the depth 217D is significantly greater than the initially-defined depth 207D, which may possibly result in a certain degree of variability of the lateral offset from the channel region 252 for the recess 217A, the overall transistor variability may nevertheless be significantly enhanced, compared to conventional strategies, since the most critical influence on transistor variability may be represented by the "shallow portion," i.e., the recess 207A, which, however, may be provided with enhanced controllability, as previously explained.

It should be appreciated, that, if desired, one or more further spacer elements, such as the spacer element 216A, may be formed, for instance, on the basis of the same material, and a subsequent etch process may be performed so as to further increase the depth of a corresponding portion of the previously-formed recess, wherein a lateral offset with respect to the channel region 252 may gradually be increased.

Figure 2F:
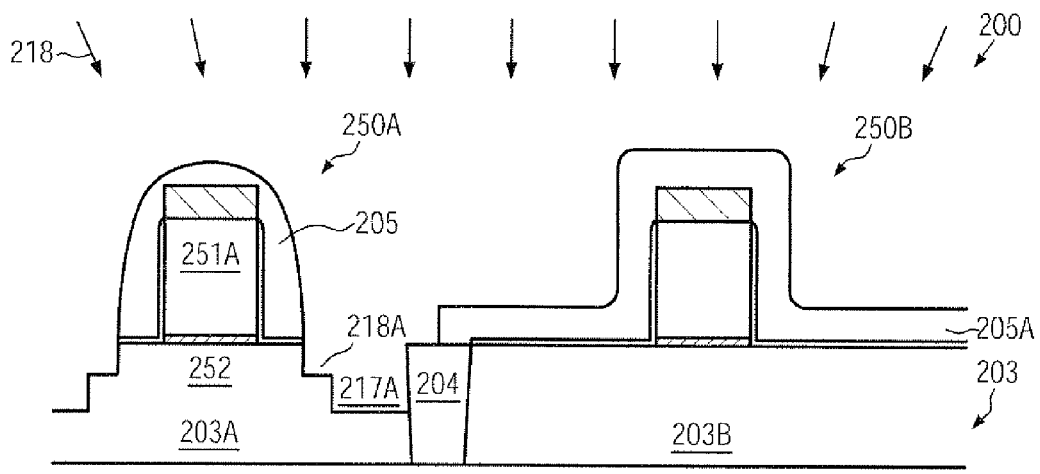

FIG. 2f schematically illustrates the semiconductor device 200 when exposed to a further etch ambient 218, which may be designed so as to remove the spacer elements 216A (FIG. 2e) selectively with respect to the spacer element 205 and the spacer layer 205A. In other illustrative embodiments, as previously explained, the transistor 250B may be covered by the spacer layer 216, when the process for forming the spacer element 216A in the transistor 250A has been performed on the basis of a corresponding etch mask, as discussed above. In this case, the spacer layer 216 and the spacer element 216A of the transistor 250A may be removed during the etch process 218. For example, well-established etch recipes, for instance on the basis of hot phosphoric acid, when the spacer element 216A is comprised of silicon nitride, may be used. In other cases, when the spacer elements 216A are provided in the form of a silicon dioxide material, other appropriate recipes, such as diluted hydrofluoric acid (HF), may be used, while the spacer layer 205A and the spacer 205 may provide integrity of the corresponding materials covered by these components. Thus, after the etch process 218, corresponding cavities 218A are formed in the semiconductor region 203A, which may thus be comprised of the recesses 207A, 217A.

Figure 2G:
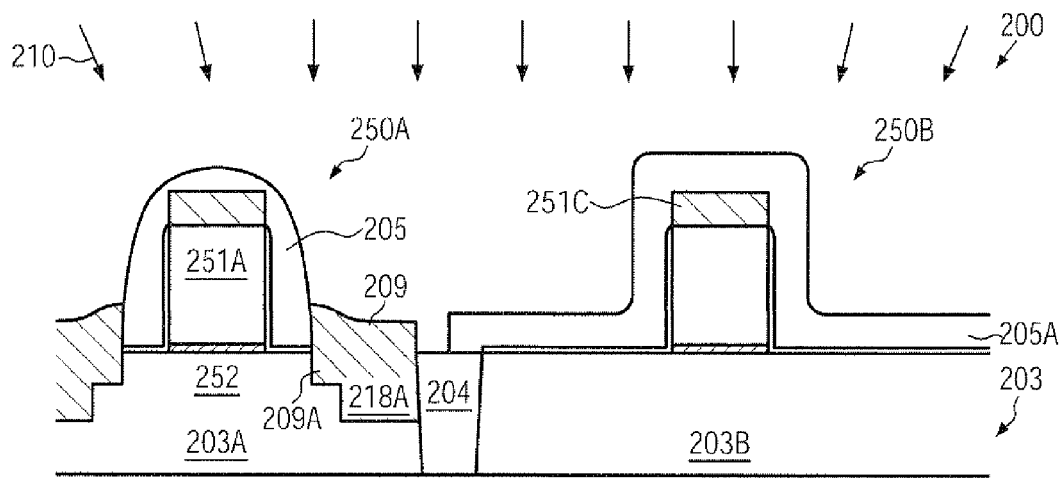

FIG. 2g schematically illustrates the semiconductor device 200 in a further advanced manufacturing stage in which a selective epitaxial growth process 210 may be performed so as to fill the cavities 218A with a strain-inducing semiconductor alloy 209. In some illustrative embodiments, the transistor 250A may represent a P-channel transistor, in which the crystallographic configuration of the semiconductor region 203A may be such that a compressive strain component acting along the current flow direction, i.e., in FIG. 2G the horizontal direction, may provide an increase of transistor performance, as previously explained. Thus, the semiconductor alloy 209 may be provided in the form of a silicon/germanium alloy, in which a fraction of germanium may be selected in accordance with the desired strain component to be induced in the channel region 252. Furthermore, due to the gradual shape of the cavities 218A, a corresponding gradual configuration of the material 209 may be accomplished, wherein a shallow portion thereof 209A may be positioned in close proximity to the channel region 252, while avoiding undue transistor variability, as previously explained with reference to the device 100. In other illustrative embodiments, the semiconductor alloy 209 may comprise tin, for instance in combination with silicon or silicon/germanium, thereby also providing a compressive strain component in the channel region 252. In still other illustrative embodiments, the transistor 250A may represent a transistor whose performance may be increased on the basis of a tensile strain component, which may be accomplished by providing the semiconductor alloy 209 in the form of a silicon/carbon alloy.

During the selective epitaxial growth process 210, the spacer element 205 and the spacer layer 205A may act as a growth mask so as to essentially avoid significant semiconductor deposition and thus maintaining integrity of the gate electrode structure 251 of the transistors 250A, 250B and also maintaining integrity of the semiconductor region 203B.

Thereafter, the further processing may be continued by removing the spacer element 205 and the spacer layer 205A, for instance on the basis of well-established etch recipes, such as hydrofluoric acid, when these components are comprised of silicon dioxide material. In other cases, any other selective etch recipe may be used, for instance, hot phosphoric acid when the spacer 205 and the spacer layer 205A are comprised of silicon nitride, as previously discussed. Thereafter, the cap layer 251C may be removed by any appropriate etch recipe, such as hot phosphoric acid, and thereafter the further processing may be continued, as is, for instance, described with reference to the device 100 as illustrated in FIG. 1E. For instance, drain and source extension regions (not shown) may be formed, followed by the formation of an appropriate spacer structure, which may then be used for defining the deep drain and source regions on the basis of ion implantation, wherein a corresponding implantation process for the transistor 250A may be significantly enhanced by introducing an appropriate dopant species on the basis of the selective epitaxial growth process 210. Thus, in this case, a desired degree of in situ doping may be accomplished during the process 210. Thereafter, appropriate anneal processes may be performed to initiate a certain degree of dopant diffusion, if desired, and also to activate dopants and re-crystallize implantation-induced damage. Next, a metal silicide may be formed in accordance with device requirements.

Figure 2H:
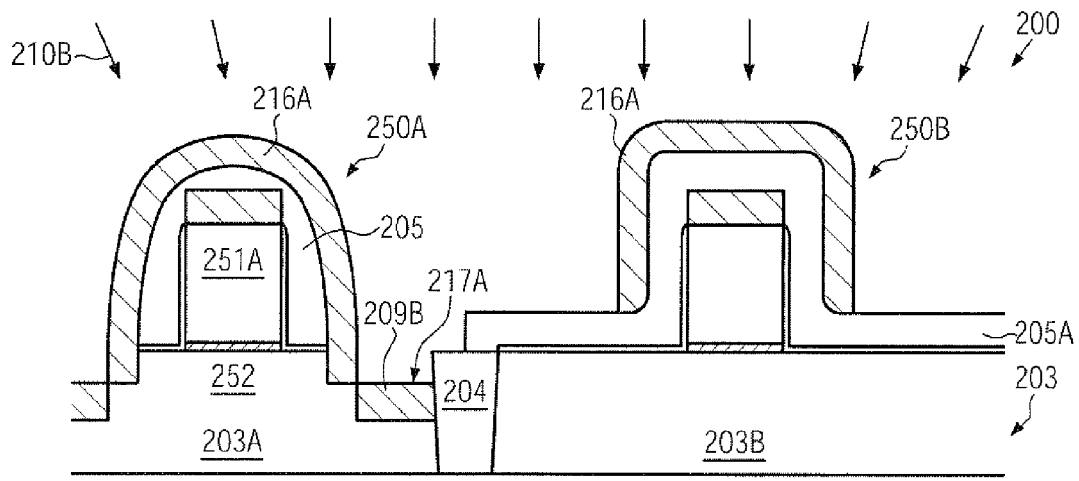
FIGS. 2h-2i schematically illustrate cross-sectional views of the semiconductor device, in which a graded cavity may be formed on the basis of two different epitaxial growth steps, in accordance with further illustrative embodiments.

FIG. 2h schematically illustrates the semiconductor device 200 according to further illustrative embodiments. As illustrated, the spacer element 216A may still be present and the device 200 may be subjected to a first epitaxial growth process 210B in order to fill in a first portion 209B into the recess 217A. Thus, during the epitaxial growth process 210B, appropriate process parameters may be established, for instance, with respect to the degree of in situ doping, material composition and the like in order to provide the lower portion 209B with the desired characteristics. For example, the degree of in situ doping may be selected so as to substantially correspond to a desired dopant concentration of deep drain and source areas for the transistor 250A. Furthermore, if desired, the concentration of a strain-inducing species of the alloy 209B may be adapted in accordance with the overall device requirements. For example, a moderately high concentration of germanium, tin and the like may be provided if a compressive stress component is desired.

Thereafter, the etch process 218 (FIG. 2F) may be performed to remove the spacer element 216A from the transistors 250A, 250B, wherein, as previously discussed, the corresponding spacer layer may be removed from above the transistor 250B, when corresponding spacer elements are not formed in this transistor as explained above. A corresponding cleaning recipe may be applied so as to prepare the exposed surface portion of the material 209B for a further selective epitaxial growth process.

Figure 2I:
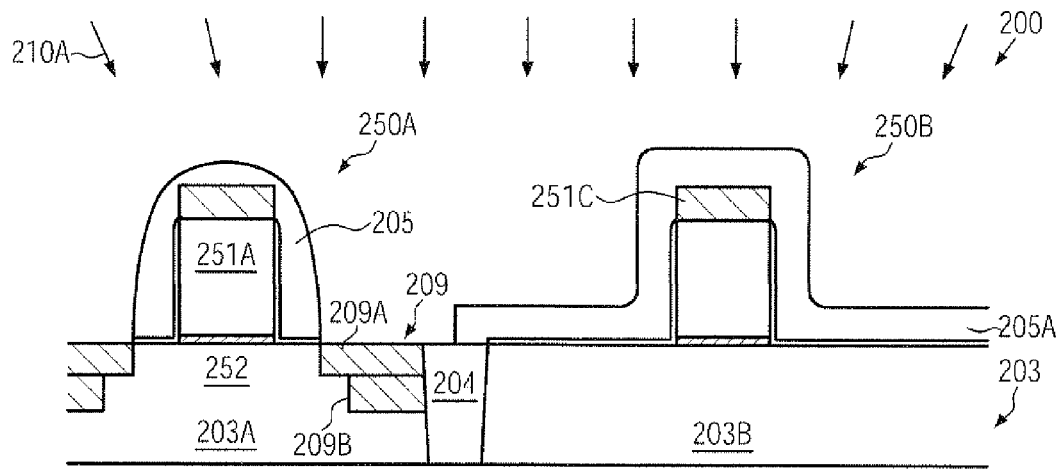

FIG. 2i schematically illustrates the semiconductor device 200 when exposed to the deposition ambient of a further selective epitaxial growth process 210A. Thus, the shallow portion 209A of the strain-inducing semiconductor alloy 209 may be formed, wherein, in addition to an overall enhanced surface topography of the material 209, different characteristics of the material 209A may be adjusted in accordance with process and device requirements. For example, an appropriate in situ doping may be achieved during the process 210A, so that a further profiling of drain and source regions still to be formed may be significantly relaxed or may even be completely omitted, thereby contributing to an even further enhanced strain-inducing effect, since corresponding implantation-induced relaxation effects may be reduced. Furthermore, if desired, the material composition may be selected differently compared to the material 209B, if required. After the epitaxial growth process 210A, the further processing may be continued, as described above.

Figure 2J:
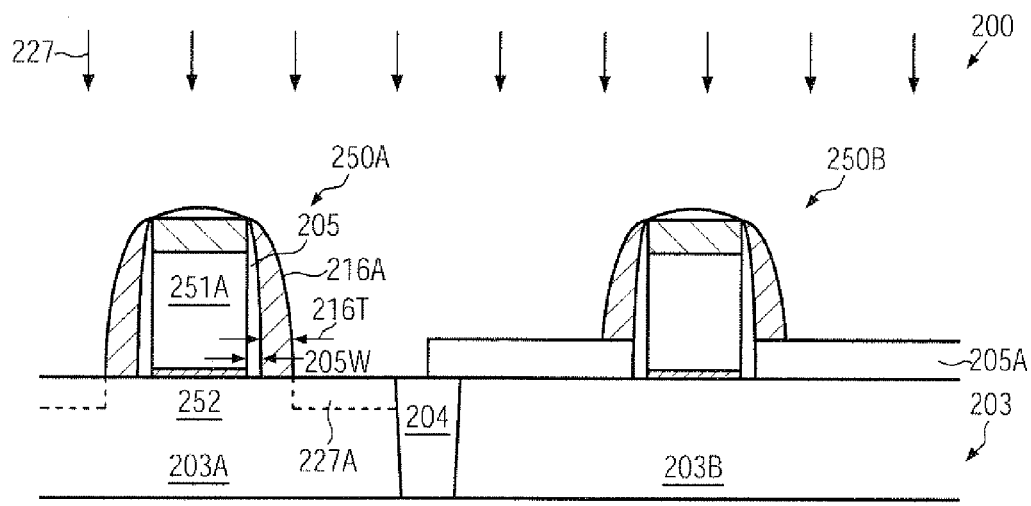
FIG. 2j-k schematically illustrate cross-sectional views of the semiconductor device during various manufacturing stages, in which a graded cavity may be formed by reducing the width of a spacer structure and performing intermediate etch processes, according to still further illustrative embodiments.
Figure 2K:
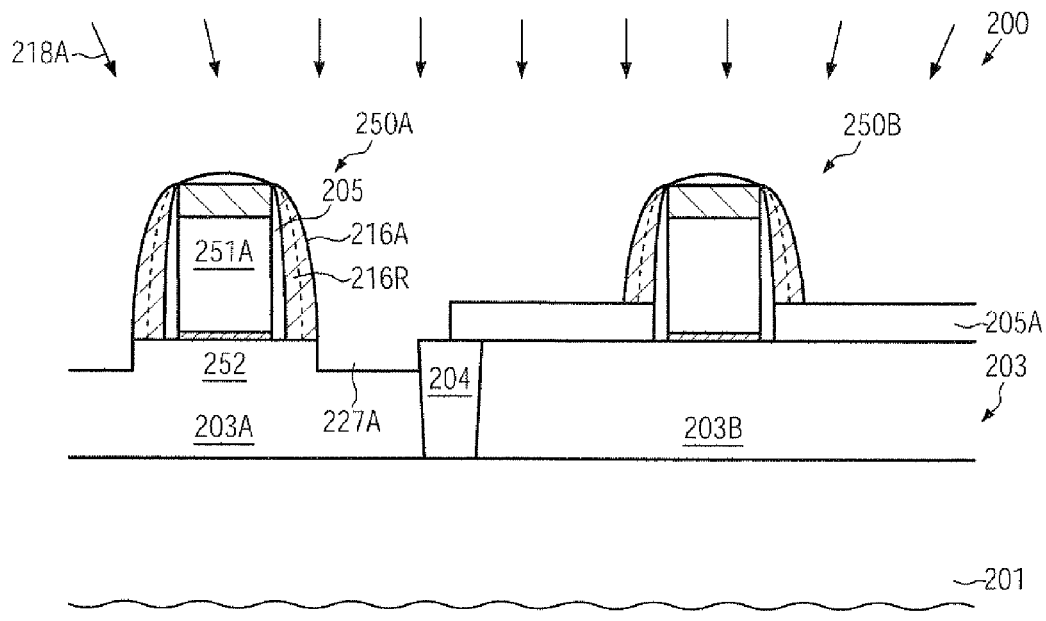
Figure 2L:
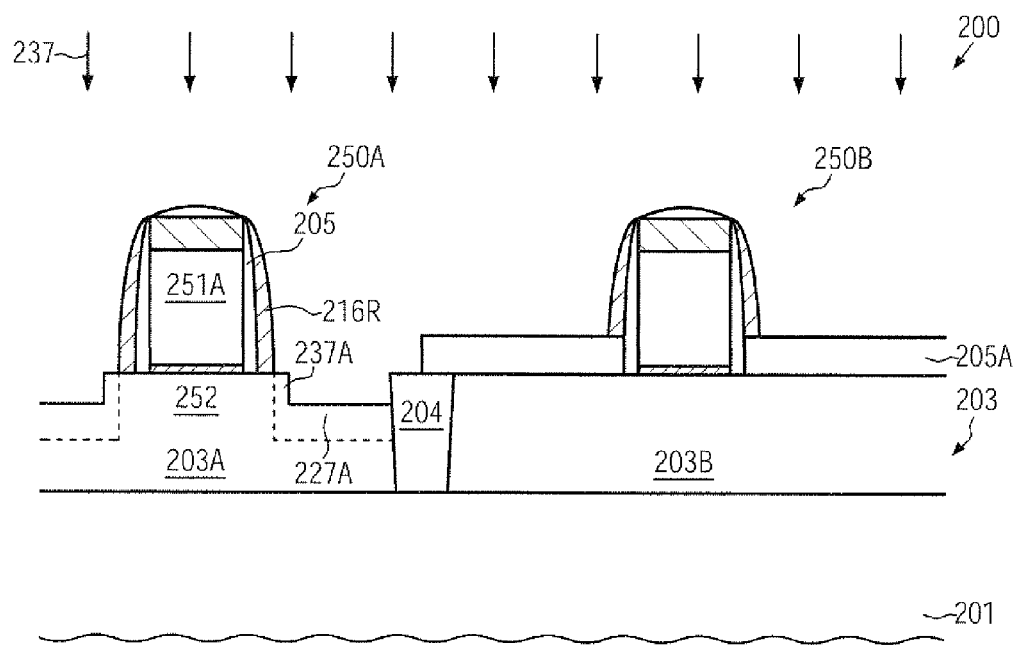
FIG. 2l schematically illustrates the semiconductor device in a further advanced manufacturing stage, in which drain and source regions may be provided, at least partially with a strain-inducing semiconductor alloy, according to illustrative embodiments.

With reference to FIGS. 2j-2l, further illustrative embodiments will now be described in which a gradually shaped cavity configuration may be accomplished by reducing the width of a spacer structure and performing corresponding cavity etch processes.

FIG. 2j schematically illustrates the semiconductor device 200 in a manufacturing stage in which the spacer element 216A may be formed at least in the transistor 250A, while the second transistor 250B may comprise a corresponding spacer layer or a spacer element 216A, depending on the etch stop capabilities of the spacer layer 205A. That is, if undue exposure of the spacer layer 205A to two or more etch atmospheres may be considered inappropriate, the spacer element 216A may be formed on the basis of a corresponding resist mask and the spacer layer may be maintained above the transistor 250B. Furthermore, the spacer element 216A may be provided with a width 216T which may represent an offset, in combination with the width 205W of the spacer element 205, that is desired for a greatest depth of the corresponding cavity. Based on the spacer element 216A, the device 200 may be exposed to an etch ambient 227 for forming a corresponding recess 227A. With respect to any process parameters of the etch process 227, the same criteria may apply as previously explained for forming the recesses 207A, 217A (FIG. 2f).

FIG. 2k schematically illustrates the semiconductor device 200 when exposed to a further etch ambient 218A, in which a portion of the spacer element 216A may be removed. For example, the etch ambient 218A may be established on the basis of hot phosphoric acid, when the spacer element 216A is comprised of silicon nitride. In other cases, any other appropriate selective etch recipe may be used. During the etch process 218A, the width of the spacer element 216A may be reduced in a highly controllable manner, for instance so as to maintain a reduced spacer element 216R in order to adjust a further lateral offset of a gradually shaped cavity, which, in the manufacturing stage shown, may include the recess 227A.

FIG. 2l schematically illustrates the semiconductor device 200 when exposed to a further etch ambient 237, during which a depth of the recess 227A may be increased, while at the same time a further recess 237A may be formed, which may have a lateral offset with respect to the channel region 252 that is determined by the width of the spacer element 216R. Thereafter, a further etch process, similar to the process 218A (FIG. 2k) may be performed to remove a spacer element 216R, thereby exposing the spacer 205, which, due to its pronounced etch selectivity compared to the spacer element 216R, may thus define a lateral offset of a corresponding recess with a high degree of uniformity. Thus, in a subsequent etch process, which may be based on similar etch parameters as the process 237, a shallow recess may be formed with a high degree of process uniformity and with a desired reduced offset from the channel region 252, as previously explained.

On the other hand, the depth of the corresponding recesses 227A, 237A may further be increased while forming the shallow recess with the minimum desired lateral offset. Consequently, in this case, corresponding cavities with a gradually shaped configuration may be accomplished, wherein a high degree of process uniformity may also result in corresponding stable transistor characteristics. Thus, after forming the gradually shaped cavities for the transistor 250A, the further processing may be continued by removing the spacer element 205 and the spacer layer 205A and filling an appropriate semiconductor alloy in the gradually shaped cavity, as previously explained.

Figure 2M:
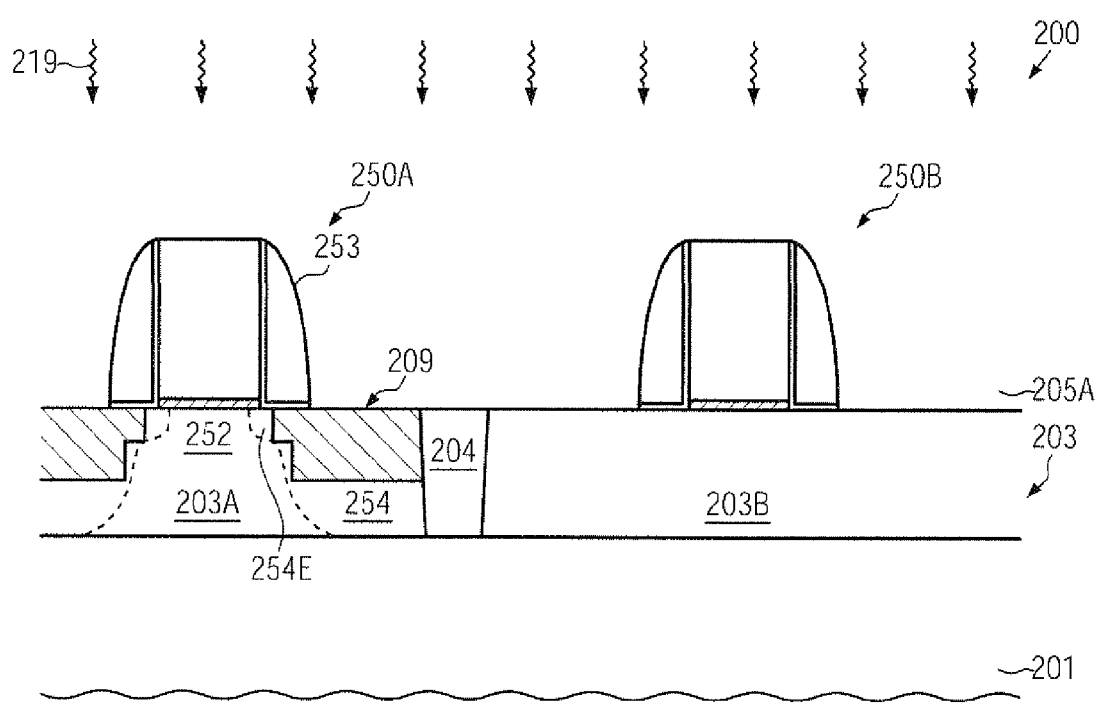
FIG. 2m schematically illustrates the semiconductor device in a further advanced manufacturing stage, in which drain and source regions may be formed on the basis of implantation sequences in combination with providing a spacer structure in order to adjust the lateral and vertical profile of the drain and source regions, according to illustrative embodiments.

FIG. 2m schematically illustrates the semiconductor device 200 in a further advanced manufacturing stage. As illustrated, the transistors 250A, 250B may comprise a spacer structure 253, which may be designed so as to adjust the lateral and vertical dopant profiles of drain and source regions 254, at least in the transistor 250A. That is, in the embodiment shown, drain and source regions 254 of the transistor 250A may be formed on the basis of implantation sequences in combination with providing the spacer structure 253 in order to adjust the lateral and vertical profile of the regions 254. As previously explained, the semiconductor alloy 209 may be provided as an in situ doped material, thereby providing enhanced flexibility in designing the overall dopant profile of the corresponding drain and source regions 254, since a reduced amount of dopant species may have to be incorporated by ion implantation processes, thereby reducing the stress relaxation effects of the corresponding implantation processes. In other cases, as previously explained, at least a significant amount of the dopant concentrations for drain and source extension regions 254E may be provided on the basis of in situ doping of at least a portion of the material 209, wherein due to the gradually shaped configuration of the material 209, the corresponding dopant species may be positioned in close proximity to the channel region. Furthermore, in some illustrative embodiments, the dopant profile of the drain and source regions 254 may be substantially completely established on the basis of the in situ doped material 209, which may have different dopant concentrations, as previously discussed. In this case, if desired, the final dopant profile may be adjusted, for instance on the basis of introducing the counter-doping species, if required, which may typically require a significantly-reduced dose during a corresponding implantation process, thereby not unduly creating implantation-induced damage. Consequently, during a corresponding anneal process 219, the finally desired dopant profile may be adjusted, for instance by initiating a certain degree of dopant diffusion, when corresponding PN junctions are to be positioned "outside" of the material 209, while, in other cases, a significant dopant diffusion may be suppressed by using well-established anneal techniques, such as laser-based techniques, flash-light anneal processes, in which the effective anneal time may be very short so as to suppress undue dopant diffusion, while nevertheless providing dopant activation and re-crystallization of implantation-induced damage.

Thereafter, the further processing may be continued, for instance by forming metal silicide regions in the drain and source regions 254, and in the gate electrode structure 251, if required, followed by the deposition of any appropriate interlayer dielectric material, which may also comprise dielectric material of high internal stress levels so as to further enhance performance of the transistor 250A and/or the transistor 250B.

As a result, the present disclosure provides semiconductor devices and corresponding manufacturing techniques in which a gradually shaped strain-inducing semiconductor material may be provided on the basis of a patterning sequence including the provision of two different spacer elements, thereby providing enhanced overall process uniformity, which may in turn enable a positioning of the strain-inducing material very closely to the channel region without unduly increasing overall transistor variability.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
   a transistor formed above a substrate, said transistor comprising:
   a gate electrode structure formed above a crystalline semiconductor region and comprising a gate electrode material;
   a first strain-inducing semiconductor alloy formed in said crystalline semiconductor region and having a first depth and a first lateral offset from said gate electrode material;
   a second strain-inducing semiconductor alloy formed in said crystalline semiconductor region and having a second depth and a second lateral offset from said gate electrode material, said first depth being less than said second depth and said first lateral offset being less than said second lateral offset; and
   source and drain regions encompassing and extending beyond said first and second strain-inducing semiconductor alloys.

2. The semiconductor device of claim 1, wherein said first and second strain-inducing semiconductor materials induce the same type of strain in a channel region of said transistor and wherein said first and second strain-inducing materials differ in at least one of a dopant concentration and a material composition.

3. The semiconductor device of claim 2, wherein said strain-inducing semiconductor alloy induces a compressive strain in said channel region.

4. The semiconductor device of claim 2, wherein strain-inducing semiconductor alloy induces a tensile strain in said channel region.

5. The semiconductor device of claim 1, wherein a gate length of said gate electrode material is approximately 50 nm or less.

6. The semiconductor device of claim 1, wherein the source and drain regions comprise source and drain extension regions.

7. The semiconductor device of claim 6, wherein the source and drain extension regions encompass and extend beyond the first strain-inducing semiconductor alloy.

* * * * *